(12) United States Patent
Wu et al.

(10) Patent No.: US 6,686,257 B1
(45) Date of Patent: Feb. 3, 2004

(54) METHOD FOR TRANSFERRING EPITAXY LAYER

(75) Inventors: YewChung Sermon Wu, Taichung (TW); PeiYan Lin, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 10/253,575

(22) Filed: Oct. 4, 2002

(30) Foreign Application Priority Data

Jul. 17, 2002 (TW) ........................................ 91115966 A

(51) Int. Cl.$^7$ .............................................. H01L 21/30
(52) U.S. Cl. .................. 438/458; 438/459; 438/481
(58) Field of Search ................................ 438/105, 406, 438/455, 458, 459, 481, 977

(56) References Cited

U.S. PATENT DOCUMENTS 5,073,230 A * 12/1991 Maracas et al. ............ 438/458
5,371,037 A * 12/1994 Yonehara ................... 438/459
6,177,359 B1 * 1/2001 Chen et al. ................. 438/458
2002/0115265 A1 * 8/2002 Iwafuchi et al. ............ 438/455

* cited by examiner

*Primary Examiner*—Chandra Chaudhari
(74) *Attorney, Agent, or Firm*—Haverstock & Owens LLP

(57) ABSTRACT

A method for transferring an epitaxy layer is provided. The method includes steps of (a) providing a first substrate, (b) forming a first epitaxy layer on the first substrate, (c) forming a masking layer having at least a pattern on the first epitaxy layer, (d) forming a second epitaxy layer on the masking layer, (e) bonding a second substrate to the second epitaxy layer, and (f) removing the masking layer and separating the second epitaxy layer from the first epitaxy layer, thereby the second epitaxy layer being transferred to the second substrate.

27 Claims, 5 Drawing Sheets

METHOD FOR TRANSFERRING EPITAXY LAYER

FIELD OF THE INVENTION

This invention relates to a method for transferring an epitaxy layer, and more particularly to a method for transferring a GaN (gallium nitride) thin film obtained by epitaxy lateral overgrowth (ELO or ELOG) method.

BACKGROUND OF THE INVENTION

Generally, various electronic or optoelectronic devices, such as light emitting diode and semiconductor laser diode, are mainly fabricated from semiconductor material which is grown by the epitaxy growth method. In this fabrication method, an epitaxial substrate is needed to be deposited by the material through its growth. And, lattice constants of the epitaxial substrate and the semiconductor material should match to each other for forming high quality semiconductor material with lower defect so as to obtain the optoelectronic and electronic devices with high performance and efficiency. However, the limited epitaxial substrate restricts the application scope and performance of the semiconductor material which is grown by the epitaxy growth method. Thus, these epitaxial material and structure are usually needed to be separated from the original epitaxial substrate and then be transferred to another substrate having different material properties which dose not allow the epitaxy material to grow thereon or can't get high quality epitaxial crystal, to increase the application.

Take GaN as an example. Recently, because GaN is difficult to grow bulk material, there dose not exist a GaN epitaxial substrate and GaN needs to epitaxy on the substrate made by other material. But, the epitaxial substrate that are usually used for growing GaN actually has some properties which are harmful to the device operation or commercial large-quantity production, such as insulation, hard, low thermal conductivity . . . etc., and all these cause the limitation of usages or efficiency of GaN. Consequently, the wafer bonding technology has been cooperated with substrate removing or substrate transferring to transfer the GaN epitaxy layer to another substrate for increasing the application or decreasing the manufacturing cost thereof.

Presently, the technologies for separating the GaN from the substrate include the laser lift off method and the smart cut method. But, both of them have limitations and disadvantages in applications. Generally, the laser lift off method is restricted by the smaller spot size of the laser beam and only can be used to separate a small portion of the GaN epitaxial layer at a time. Except the disadvantage described above, another drawback with using this method is that the energy of the laser beam is not easy to spread averagely and will then cause different decomposition rate and heat accumulation in different portions of the GaN epitaxy layer. Because it is hard to precisely control the heat transfer and decomposition at the GaN/substrate interface, partial surface of GaN layer therefore will become rough after being separated by this method. Furthermore, because of a thermal shock in the material, the quality of the GaN layer will be reduced, even more the GaN layer will be unusable. Consequently, the expensive laser equipment with smaller production efficiency is inappropriate for large-quantity production and also not suitable for saving the cost.

As to the smart cut method, this method implants ions into the epitaxy layers before wafer bonding being progressed. Thus, the epitaxy layers are heated to vaporize ions to provide pressure for separating. However, the ion implantation process will destroy the crystal structure of the epitaxial layer, and the defect density which influences the device performance and the material quality will also be increased. Consequently, this method is not suitable to transfer semiconductor epitaxy layer for commercial purpose, either.

In addition, both of the methods have some other disadvantages that they are not appropriate for transferring the epitaxial layer in large area, the transferred epitaxial layer owns low quality, the epitaxial substrate can not be recycled, and the cost of the manufacturing process is much higher.

Because of the problems described above, the applicant keeps on carving unflaggingly to develop a "method for transferring epitaxy layer" through wholehearted experience and research.

SUMMARY OF THE INVENTION

It is an object of the present invention to provide a method for transferring an epitaxy layer obtained by a lateral overgrowth method to a needed substrate without hurting the original substrate and the epitaxy lateral overgrowth layer.

It is another object of the present invention to transfer a GaN epitaxy layer obtained by the lateral overgrowth method to another selectable substrate for obtaining a high quality GaN with a selectable substrate to providing different usages therefor.

In accordance with an aspect of the present invention, a method for transferring an epitaxy layer includes steps of (a) providing a first substrate, (b) forming a first epitaxy layer on the first substrate, (c) forming a masking layer having at least a pattern on the first epitaxy layer, (d) forming a second epitaxy layer on the masking layer, (e) bonding a second substrate to the second epitaxy layer, and (f) removing the masking layer and separating the second epitaxy layer from the first epitaxy layer, thereby the second epitaxy layer being transferred to the second substrate.

Preferably, the first substrate is one selected from a group consisting of gallium arsenide, sapphire, silicon carbide, and silicon.

Preferably, the first epitaxy layer includes a low-temperature buffer layer (LT-Buffer Layer) and a high-temperature epitaxy layer.

Preferably, the LT-Buffer Layer is one selected from a group consisting of gallium nitride, aluminum nitride, and gallium aluminum nitride.

Preferably, the LT-Buffer layer is formed at a temperature ranged from 600 to 700° C. and has a thickness ranged from 200 to 500 Å.

Preferably, the high-temperature epitaxy layer includes gallium nitride.

Preferably, the high-temperature layer is formed at a temperature ranged from 1000 to 1100° C. and has a thickness about 1.5 µm.

Preferably, the masking layer is one of a metal and a ceramic.

Preferably, the metal includes tungsten.

Preferably, the ceramic includes one of silicon nitride and silica.

Preferably, at least a pattern includes one of dot opening and line opening.

Preferably, the step (d) further includes a step (d1) of forming a bonding medium layer on the second epitaxy layer.

Preferably, the bonding medium layer is one selected from a group consisting of palladium (Pd), titanium (Ti), indium (In), nickel (Ni), gold (Au), and a mixture thereof.

Preferably, the second epitaxy layer is an epitaxy lateral overgrowth layer.

Preferably, the second epitaxy layer includes gallium nitride (GaN).

Preferably, the step (e) further comprises a step (e1) of forming a bonding medium layer on the second substrate.

Preferably, the bonding medium layer is one selected from a group consisting of palladium (Pd), titanium (Ti), indium (In), nickel (Ni), gold (Au), and a mixture thereof.

Preferably, the second substrate includes silicon.

Preferably, the step (e) is implemented by a wafer bonding process.

Preferably, the wafer bonding process further includes a thermal annealing process.

Preferably, the step (f) is executed by a wet etching.

In accordance with another aspect of the present invention, a method for transferring an epitaxy layer includes steps of (a) providing a first substrate, (b) forming a first epitaxy layer on the first substrate, (c) forming a masking layer on the first epitaxy layer and then etching the masking layer to form at least a pattern, (d) forming a second epitaxy layer on the masking layer, (e) removing the masking layer, and (f) bonding a second substrate to the second epitaxy layer and separating the second epitaxy layer from the first epitaxy layer so as to obtain the second substrate with the second epitaxy layer.

Preferably, the first epitaxy layer includes a low-temperature buffer layer (LT-Buffer Layer) and a high-temperature epitaxy layer.

Preferably, the step (d) further (d1) of forming a bonding medium layer on the second epitaxy layer.

Preferably, the second epitaxy layer is an epitaxy lateral overgrowth layer.

Preferably, the step (e) is executed by a wet etching.

Preferably, the step (f) further comprises a step (f1) of forming a bonding medium layer on the second substrate.

Preferably, the step (f) is implemented by a wafer bonding process.

Preferably, the wafer bonding process further includes a thermal annealing process.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
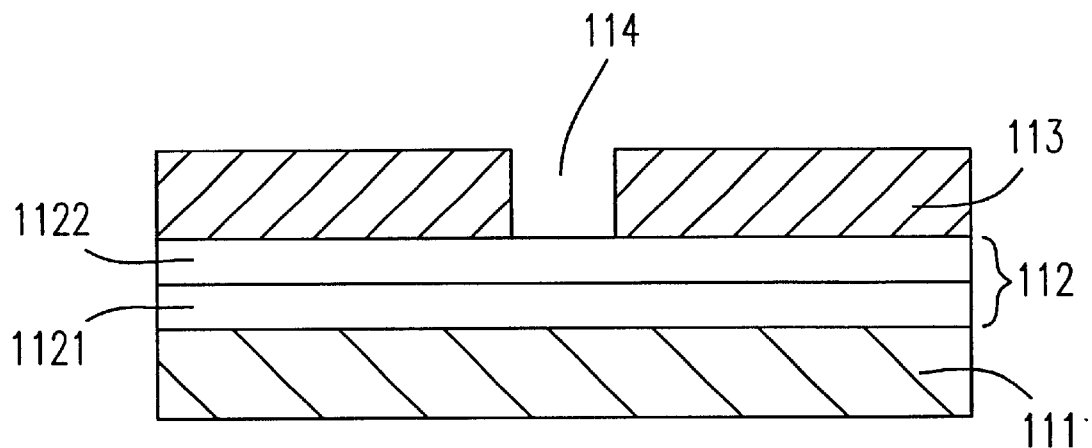
FIGS. 1A~1D are the schematic views of the manufacturing methods and steps for transferring a GaN epitaxy layer in a preferred embodiment according to the present invention.

Please refer to FIGS. 1A~1D which illustrate the schematic views of the manufacturing methods and steps for transferring a GaN epitaxy layer in a preferred embodiment according to the present invention. As shown in FIG. 1A, a first GaN epitaxy layer 112 is formed on a first substrate 111. Generally, the substrate for forming the GaN epitaxy layer is mostly a sapphire substrate which has a suitable lattice constant and crystal structure for forming a high quality GaN epitaxy layer. However, uneasy to be cut and not conductive are the disadvantages thereof. In the preferred embodiment according to the present invention, the first GaN epitaxy layer 112 includes a low-temperature GaN epitaxy layer 1121 (Low-Temperature Buffer Layer, LT-Buffer Layer) and a high-temperature GaN epitaxy layer 1122. The LT-buffer layer 1121 is a GaN or a sapphire layer deposited on the first substrate 111 with a thickness ranged from 200 to 500 Å and is formed at a temperature ranged from 600 to 700° C. And the high-temperature GaN epitaxy layer 1122 is a GaN layer deposited on the low-temperature epitaxy layer 1121 with a thickness about 1.5 $\mu$m and is formed at a temperature ranged from 1000 to 1100° C. In this preferred embodiment of the present invention, the first substrate, the low-temperature GaN epitaxy layer, and the high-temperature GaN epitaxy layer constitute an epitaxial combination substrate.

Figure 1B:
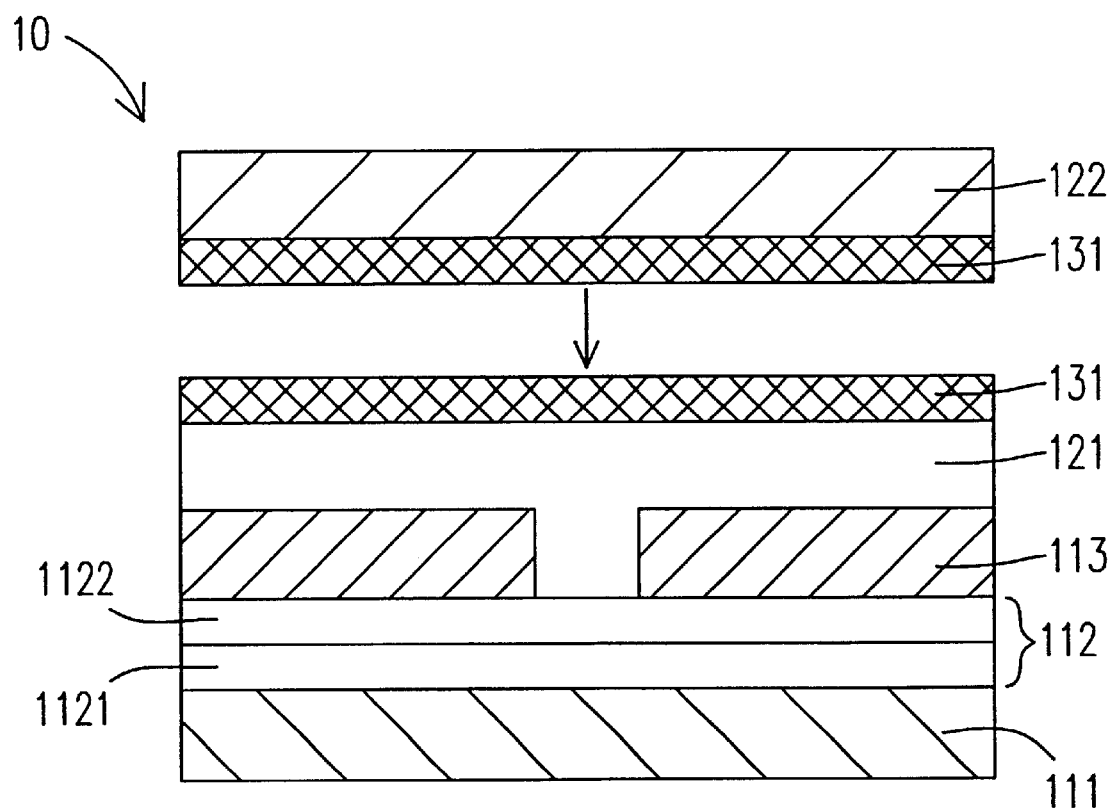

Sequentially, a masking layer 113 is formed on the first GaN epitaxy layer 112, and at least a pattern 114 is formed on the masking layer 113 by etching, wherein the masking layer 113 can be made of metal or ceramic such as silica, silicon nitride, and tungsten, and the at least a pattern 114 includes one of dot opening and line opening. Then, as shown in FIG. 1B, a second GaN epitaxy layer 121 is formed on the masking layer 113, wherein the second GaN epitaxy layer 121 is formed by an epitaxy lateral overgrowth process until the grown epitaxy lateral overgrowth crystal is smooth and parallel to the surface of the substrate (however, in the process, the lateral epitaxy overgrowth crystal can be coalescence to complete, or be not coalescence and only let the surface of the individual die become smooth), and is formed at a temperature ranged from 1000 to 1100° C. Moreover, a second substrate 122 (the substrate wanted to be transferred thereon) is connected to the second GaN epitaxy lateral overgrowth layer 121 by a wafer bonding process, wherein the material of the second substrate 122 is not limited and is determined by the purposes and demands after transferring, and the bonding temperature is depended on the materials of the second substrate 122 and the second epitaxy layer 121. At the same time, if needed, a bonding medium layer 131 can respectively be covered on the second substrate 122 and the second GaN epitaxy lateral overgrowth layer 121 for assisting the wafer bonding. The bonding medium layer 131 can be a single or multiple layers which are made of metals, such as palladium (Pd), titanium (Ti), indium (In), nickel (Ni), and gold (Au).

Figure 1C:
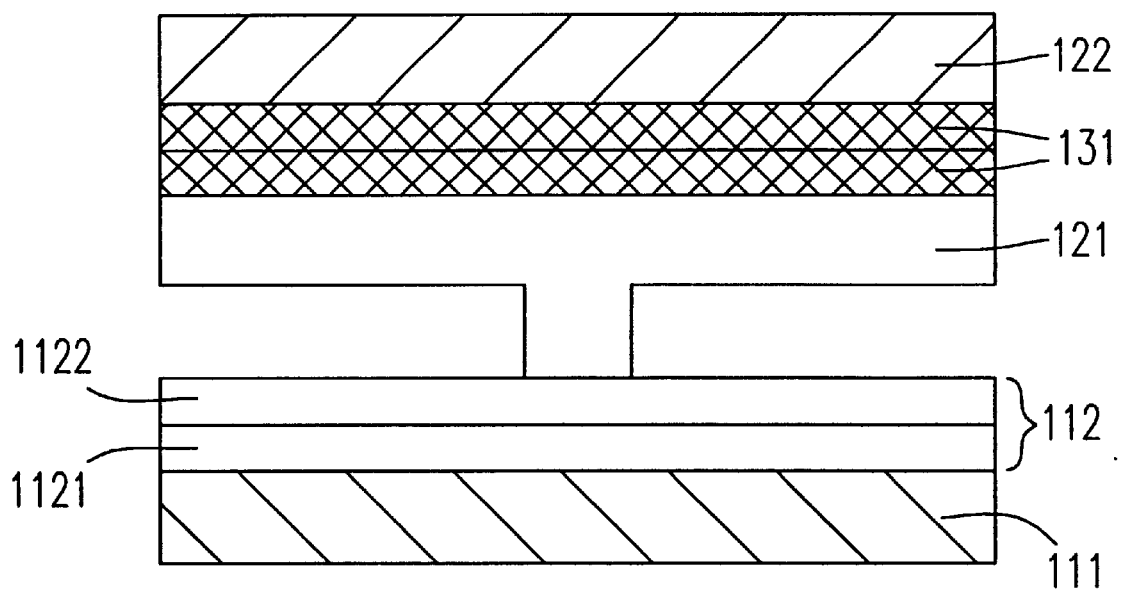
Figure 1D:
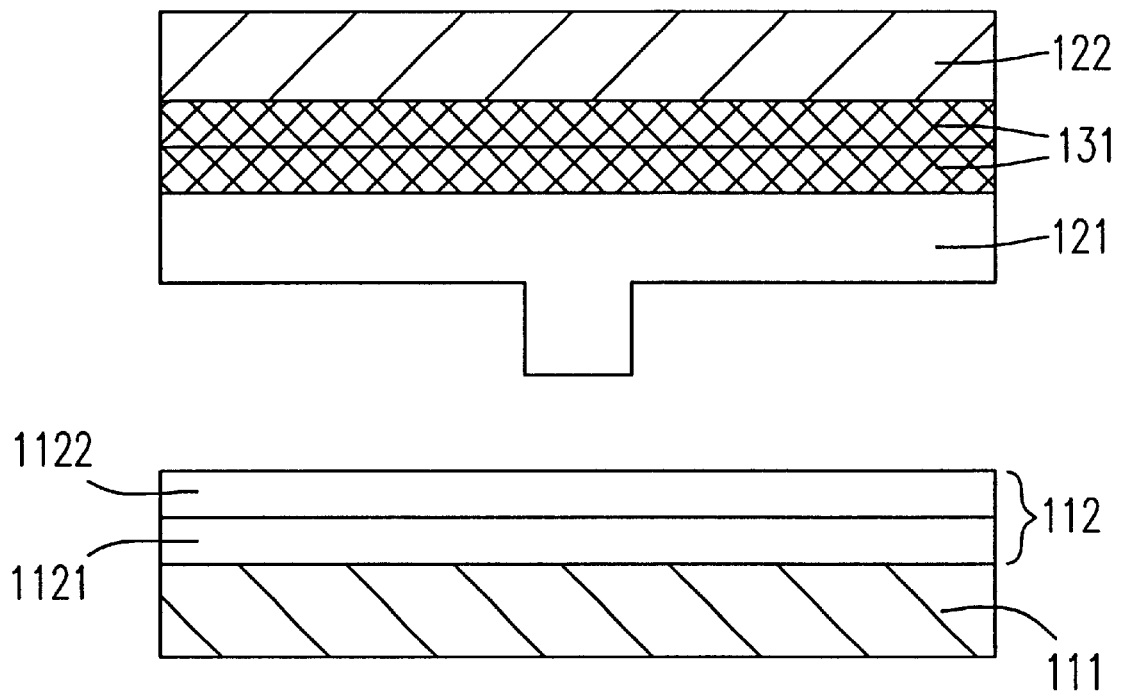

Continuously, a wet etching is employed to etch the masking layer 113 and to form a suspended structure, as shown in FIG. 1C, by immersing the wafer bonding assembly 10 in an etching liquid. The selection of the etching liquid is depended on the materials of the masking layer 113 and the second substrate 122, for which can rapidly etch the masking layer 113 without hurting the substrates and the epitaxy layers. Finally, as shown in FIG. 1D, the first GaN epitaxy layer 112 and the second GaN epitaxy layer 121 can be separated, thereby the second epitaxy layer 121 being transferred to the second substrate 122.

In this preferred embodiment according to the present invention, the wafer bonding process not only provides a new supporting substrate, but also accelerates the separation between the epitaxial combination substrate and the second epitaxy layer with the second substrate. And because the wafer bonding process further includes a thermal annealing process and pressure adding process, it will cause the stress concentration on the connecting point through the different thermal expansion coefficients of the substrate and GaN. Otherwise, the selective wet etching possesses some advantages, such as high selective ratio, won't destroy the epitaxy layers, low cost, and suitable for large area, and is a suitable method for the present invention to remove the masking layer. Furthermore, after separating, the epitaxial combination substrate constituted by the first substrate, the low-temperature GaN epitaxy layer, and the high-temperature GaN epitaxy layer will not be destroyed by the wet etching process and can be recycled so as to reduce the cost. Most importantly, after transferring, the epitaxy lateral overgrowth layer owns low defect density which can increase the life and efficiency thereof when being applied to the devices.

Figure 2A:
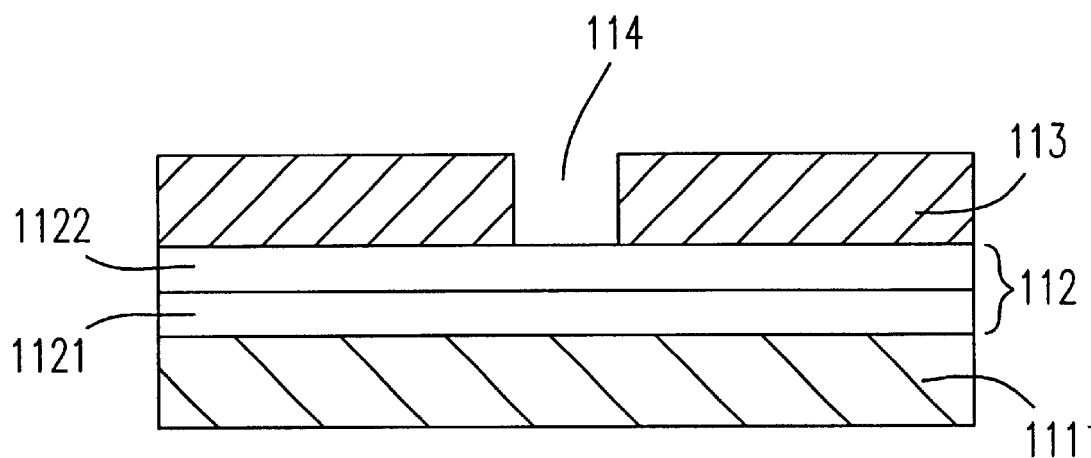
FIGS. 2A~2F are the schematic views of the manufacturing methods and steps for transferring a GaN epitaxy layer in the other preferred embodiment according to the present invention.
Figure 2B:
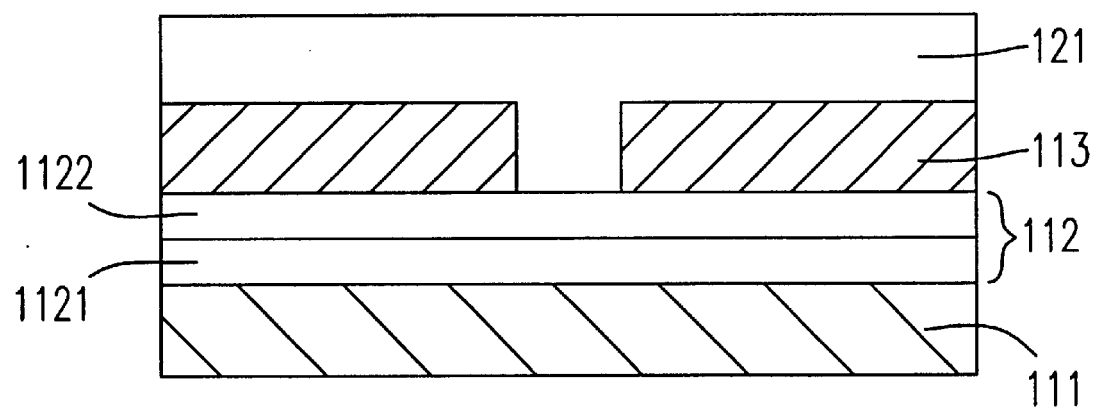
Figure 2C:
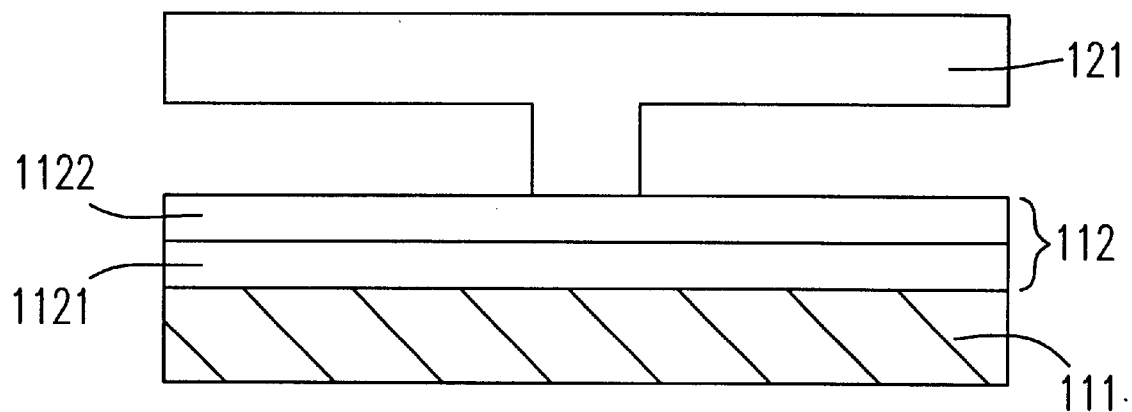
Figure 2D:
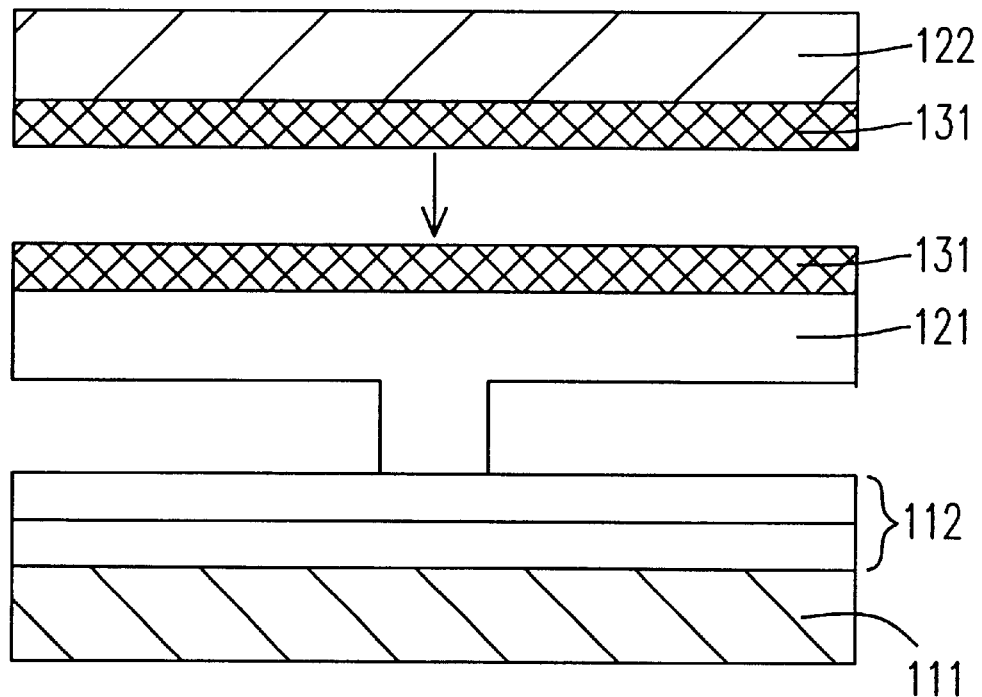
Figure 2E:
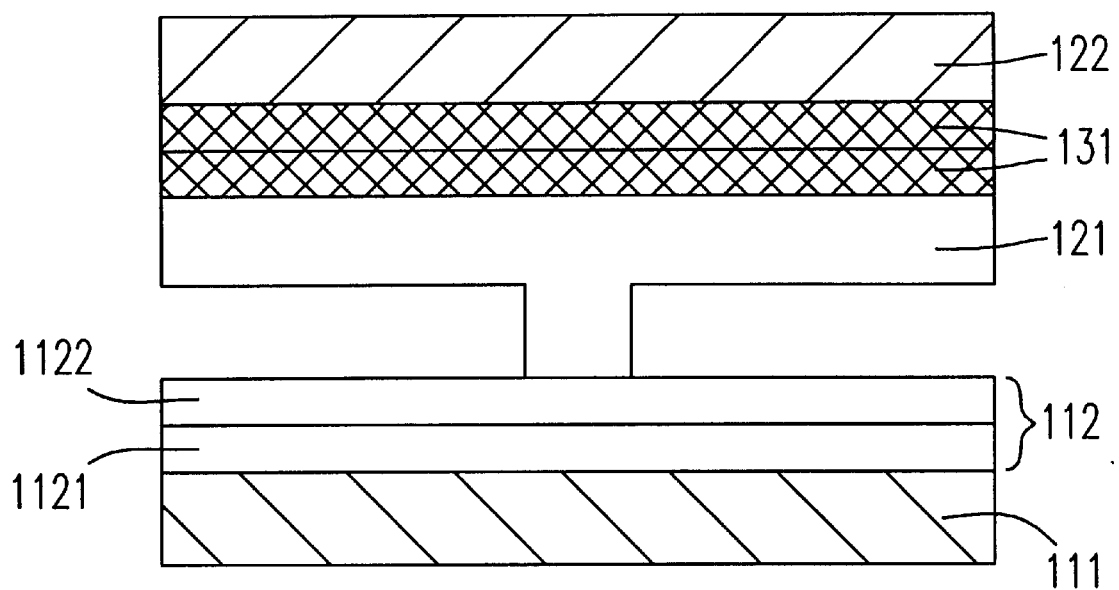
Figure 2F:
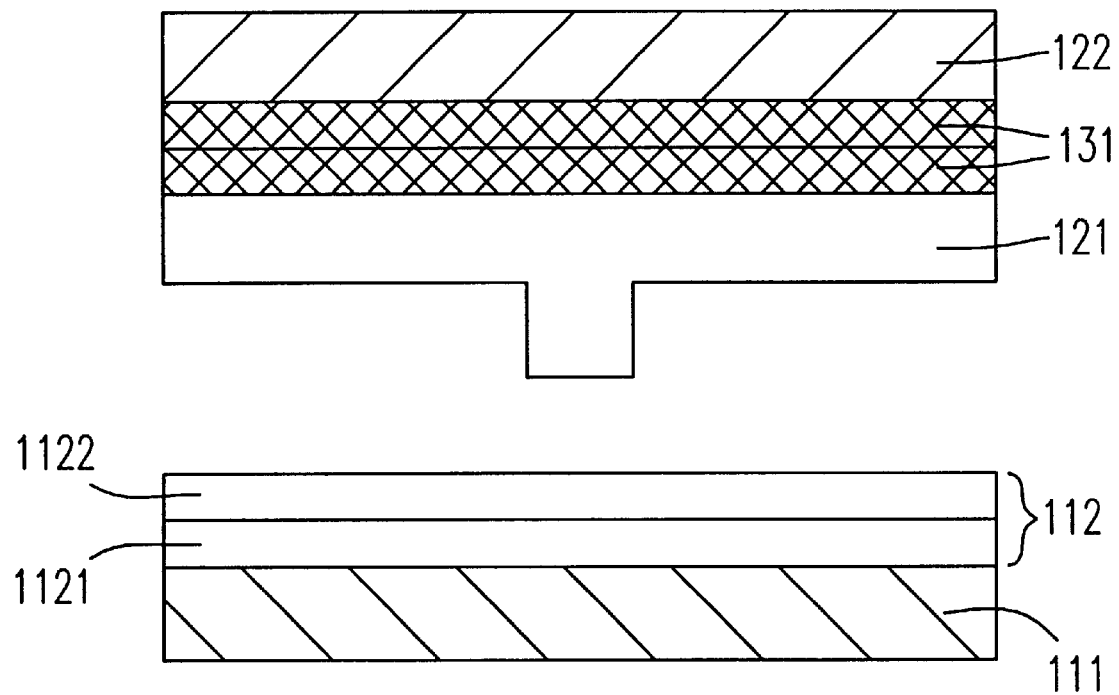

Otherwise, the steps sequence for transferring the epitaxy layer to another substrate would not be limited in the sequence described above. It can be altered as etching the masking layer ahead for forming the suspended structure before wafer bonding the second substrate to the second epitaxy lateral overgrowth layer, as shown in FIGS. 2A~2C. And then the wafer bonding process is proceeded, as shown in FIGS. 2D~2F, and simultaneously the separating process is promoted through the thermal annealing or pressure adding in the wafer bonding process.

In view of the aforesaid, the manufacturing process in the present invention can transfer the epitaxy lateral overgrowth layer to every kind of substrate and still maintain in high quality. According to this, the process not only can provide various usages of the epitaxy layer but also can solve the problems of the existing substrates in the manufacturing process and in the utilization, such as not conductive, uneasy being cut, uneasy to transfer the heat, and high cost of the material or device. At the same time, it also solves the disadvantage of the existing substrate transferring method, for example: damaging the epitaxy layer, unsuitable for the commercial large size, and high cost. Furthermore, the improvement to the manufacturing process can be achieved without expansive equipment; even more the epitaxial combination substrate can be recycled to reduce the cost. Consequently, the present invention owns the value for industrial development.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for transferring an epitaxy layer comprising steps of:

(a) providing a first substrate;

(b) forming a first epitaxy layer on said first substrate, wherein said first epitaxy layer comprises a low-temperature buffer layer (LT-Buffer Layer) and a high-temperature epitaxy layer;

(c) forming a masking layer having at least a pattern on said first epitaxy layer;

(d) forming a second epitaxy layer on said masking layer;

(e) bonding a second substrate to said second epitaxy layer; and (f) removing said masking layer and separating said second epitaxy layer from said first epitaxy layer, thereby said second epitaxy layer being transferred to said second substrate.

2. A method according to claim 1 wherein said first substrate is one selected from a group consisting of gallium arsenide, sapphire, silicon carbide, and silicon.

3. A method according to claim 1 wherein said LT-Buffer Layer is one selected from a group consisting of gallium nitride, aluminum nitride, and gallium aluminum nitride.

4. A method according to claim 1 wherein said LT-Buffer layer is formed at a temperature ranged from 600 to 700° C. and has a thickness ranged from 200 to 500 Å.

5. A method according to claim 1 wherein said high-temperature epitaxy layer includes gallium nitride.

6. A method according to claim 1 wherein said high-temperature layer is formed at a temperature ranged from 1000 to 1100° C. and has a thickness about 1.5 $\mu$m.

7. A method according to claim 1 wherein said masking layer is one of a metal and a ceramic.

8. A method according to claim 7 wherein said metal includes tungsten.

9. A method according to claim 7 wherein said ceramic includes one of silicon nitride and silica.

10. A method according to claim 1 wherein said at least a pattern includes one of dot opening and line opening.

11. A method according to claim 1 wherein said step (d) further comprises a step (d1) of forming a bonding medium layer on said second epitaxy layer.

12. A method according to claim 11 wherein said bonding medium layer is one selected from a group consisting of palladium (Pd), titanium (Ti), indium (In), nickel, gold, and a mixture thereof.

13. A method according to claim 1 wherein said second epitaxy layer is an epitaxy lateral overgrowth layer.

14. A method according to claim 1 wherein said second epitaxy layer includes gallium nitride (GaN).

15. A method according to claim 1 wherein said step (e) further comprises a step (e1) of forming a bonding medium layer on said second substrate.

16. A method according to claim 15 wherein said bonding medium layer is one selected from a group consisting of palladium (Pd), titanium (Ti), indium (In), nickel, gold, and a mixture thereof.

17. A method according to claim 1 wherein said second substrate includes silicon.

18. A method according to claim 1 wherein said step (e) is implemented by a wafer bonding process.

19. A method according to claim 18 wherein said wafer bonding process further comprises a thermal annealing process.

20. A method according to claim 1 wherein said step (f) is executed by a wet etching.

21. A method for transferring an epitaxy layer comprising steps of:

(a) providing a first substrate;

(b) forming a first epitaxy layer on said first substrate, wherein said first epitaxy layer comprises a low-temperature buffer layer (LT-Buffer Layer) and a high-temperature epitaxy layer;

(c) forming a masking layer on said first epitaxy layer and then etching said masking layer to form at least a pattern;

(d) forming a second epitaxy layer on said masking layer;

(e) removing said masking layer; and (f) bonding a second substrate to said second epitaxy layer and separating said second epitaxy layer from said first epitaxy layer so as to obtain said second substrate with said second epitaxy layer.

22. A method according to claim 21 wherein said step (d) further comprises a step (d1) of forming a bonding medium layer on said second epitaxy layer.

23. A method according to claim 21 wherein said second epitaxy layer is an epitaxy lateral overgrowth layer.

24. A method according to claim 21 wherein said step (e) is executed by a wet etching.

25. A method according to claim 21 wherein said step (f) further comprises a step (f1) of forming a bonding medium layer on said second substrate.

26. A method according to claim 21 wherein said step (f) is implemented by a wafer bonding process.

27. A method according to claim 26 wherein said wafer bonding process further comprises a thermal annealing process.

* * * * *